US009659850B2

(12) United States Patent
We et al.

(10) Patent No.: US 9,659,850 B2
(45) Date of Patent: May 23, 2017

(54) PACKAGE SUBSTRATE COMPRISING CAPACITOR, REDISTRIBUTION LAYER AND DISCRETE COAXIAL CONNECTION

(71) Applicant: QUALCOMM Incorporated, San Diego, CA (US)

(72) Inventors: Hong Bok We, San Diego, CA (US); Kyu-Pyung Hwang, San Diego, CA (US); Young Kyu Song, San Diego, CA (US); Dong Wook Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/563,854

(22) Filed: Dec. 8, 2014

(65) Prior Publication Data

US 2016/0163628 A1 Jun. 9, 2016

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 21/4853* (2013.01);
(Continued)

(58) Field of Classification Search
CPC .............. H01L 23/4824; H01L 24/83; H01L 23/49838; H01L 23/49811; H01L 21/4853;
(Continued)

(56) References Cited

U.S. PATENT DOCUMENTS 5,745,334 A * 4/1998 Hoffarth ............... H05K 1/162
361/303
5,939,782 A 8/1999 Malladi
(Continued)

FOREIGN PATENT DOCUMENTS

| EP | 1691590 A2 | 8/2006 |
|---|---|---|
| JP | 2004228190 A | 8/2004 |
| JP | 2005191559 A | 7/2005 |

OTHER PUBLICATIONS

Definition of traverse. (n. d.) Collins English Dictionary—Complete and Unabridged, 12th Edition 2014. (1991, 1994, 1998, 2000, 2003, 2006, 2007, 2009, 2011, 2014). Retrieved May 1, 2016 from //www.thefreedictionary.com/traverse.*
(Continued)

*Primary Examiner* — Michael Jung
(74) *Attorney, Agent, or Firm* — Loza & Loza LLP

(57) ABSTRACT

A package substrate that includes a first portion and a redistribution portion. The first portion is configured to operate as a capacitor. The first portion includes a first dielectric layer, a first set of metal layers in the dielectric layer, a first via in the dielectric layer, a second set of metal layers in the dielectric layer, and a second via in the dielectric layer. The first via is coupled to the first set of metal layers. The first via and the first set of metal layers are configured to provide a first electrical path for a ground signal. The second via is coupled to the second set of metal layers. The second via and the second set of metal layers are configured to provide a second electrical path for a power signal. The redistribution portion includes a second dielectric layer, and a set of interconnects.

19 Claims, 15 Drawing Sheets

(51) Int. Cl.
　　*H05K 1/16*　　　　(2006.01)
　　*H01L 23/66*　　　(2006.01)
　　*H01L 23/482*　　(2006.01)
　　*H01L 23/00*　　　(2006.01)

(52) U.S. Cl.
　　CPC ...... *H01L 21/4857* (2013.01); *H01L 23/4824* (2013.01); *H01L 23/49811* (2013.01); *H01L 23/49822* (2013.01); *H01L 23/49838* (2013.01); *H01L 23/49894* (2013.01); *H01L 23/66* (2013.01); *H01L 24/83* (2013.01); *H05K 1/162* (2013.01); *H01L 2223/6622* (2013.01); *H01L 2224/16225* (2013.01); *H01L 2224/32225* (2013.01); *H01L 2224/73204* (2013.01); *H01L 2224/92125* (2013.01); *H01L 2924/15174* (2013.01); *H01L 2924/15311* (2013.01)

(58) Field of Classification Search
　　CPC .. H01L 23/49827; H05K 1/0298; H05K 3/46; H05K 3/284
　　See application file for complete search history.

(56) References Cited

U.S. PATENT DOCUMENTS

| | | | |
|---|---|---|---|
| 6,072,690 A | 6/2000 | Farooq et al. | |
| 6,388,207 B1 | 5/2002 | Figueroa et al. | |
| 6,611,419 B1* | 8/2003 | Chakravorty | H01L 23/49822 257/E23.062 |
| 6,891,258 B1* | 5/2005 | Alexander | H01G 4/232 257/678 |
| 7,132,743 B2 | 11/2006 | Palanduz | |
| 7,327,554 B2 | 2/2008 | Otsuka et al. | |
| 7,339,798 B2 | 3/2008 | Chakravorty | |
| 2002/0076919 A1* | 6/2002 | Peters | H01L 23/49822 438/637 |
| 2004/0188826 A1 | 9/2004 | Palanduz et al. | |
| 2004/0264103 A1 | 12/2004 | Otsuka et al. | |
| 2007/0085200 A1* | 4/2007 | Lu | H01L 21/4857 257/724 |
| 2008/0239622 A1* | 10/2008 | Hsu | H05K 1/162 361/306.2 |
| 2009/0213526 A1* | 8/2009 | Hsu | H01G 4/005 361/306.1 |
| 2009/0243756 A1* | 10/2009 | Stevenson | H01G 4/40 333/172 |
| 2009/0266594 A1* | 10/2009 | Yoshikawa | H05K 1/162 174/260 |
| 2011/0017503 A1* | 1/2011 | Hardin | H05K 1/184 174/260 |
| 2012/0211885 A1* | 8/2012 | Choi | H01L 23/3128 257/737 |

OTHER PUBLICATIONS

International Search Report and Written Opinion—PCT/US2015/064039—ISA/EPO—Mar. 7, 2016.

* cited by examiner

PROFILE VIEW

PLAN VIEW

PLAN VIEW

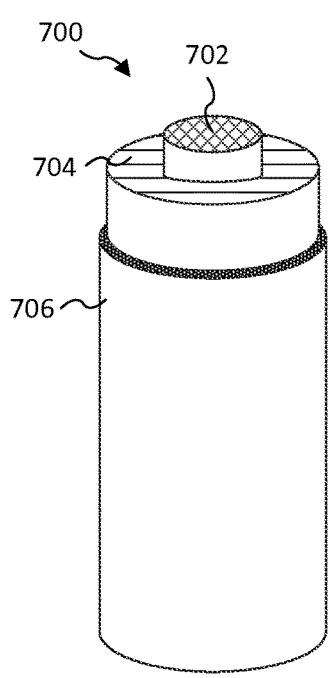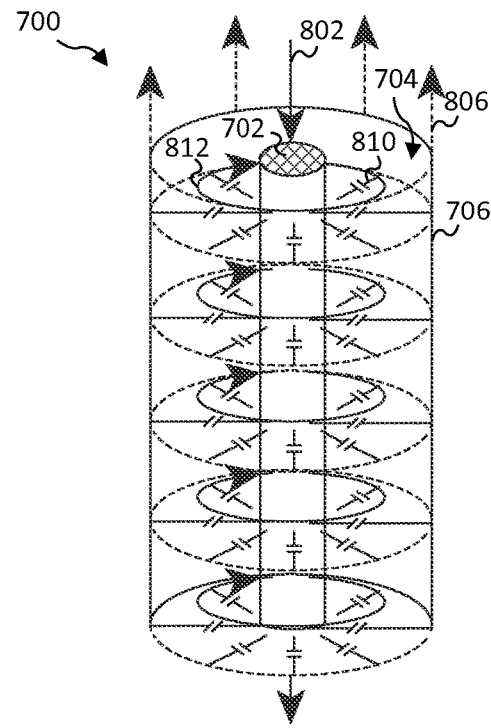
FIG. 7  FIG. 8
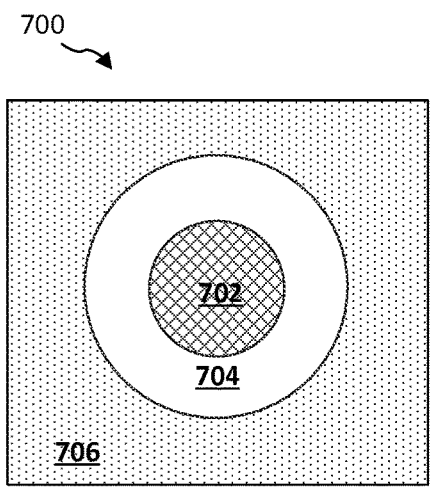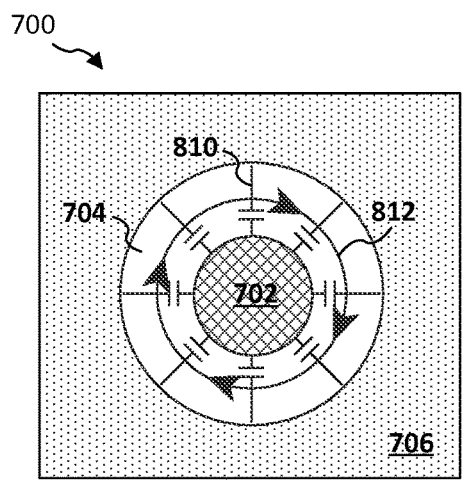
FIG. 9  FIG. 10

CONTINUOUS COAXIAL CONNECTION

PROFILE VIEW

DISCRETE COAXIAL CONNECTION

PROFILE VIEW

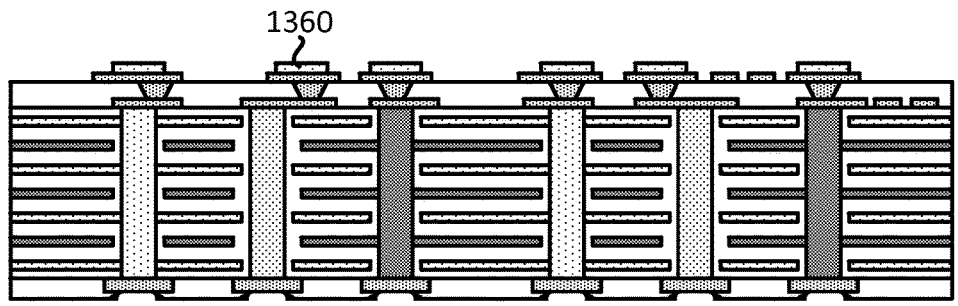
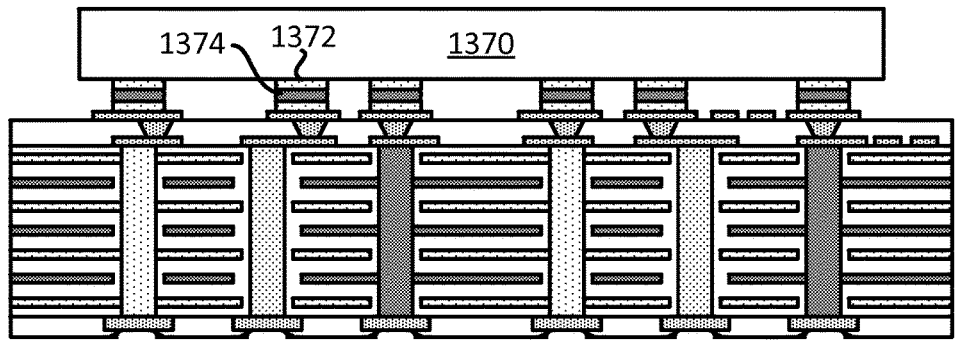
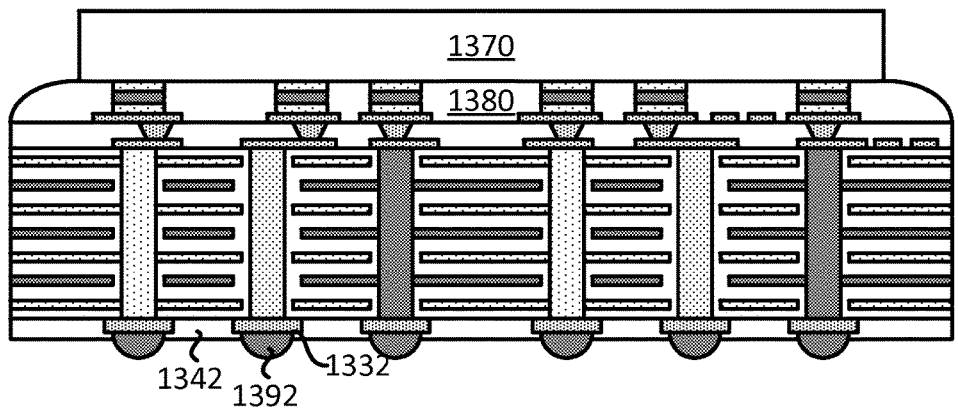
FIG. 13C

PACKAGE SUBSTRATE COMPRISING CAPACITOR, REDISTRIBUTION LAYER AND DISCRETE COAXIAL CONNECTION

BACKGROUND

Field

Various features relate to a package substrate that includes a capacitor, a redistribution layer, and a discrete coaxial connection.

Background

FIG. 1 illustrates a conventional configuration of an integrated package that includes a die and a capacitor. Specifically, FIG. 1 illustrates an integrated package 100 that includes a package substrate 104 and a first die 106. The integrated package 100 is coupled to a printed circuit board (PCB) 102 through a first set of solder balls 105. The first die 106 is coupled to the package substrate 104 through a second set of solder balls 107. The package substrate 104 includes one or more dielectric layers 110, and a set of interconnects 112 (e.g., traces and vias). The set of interconnects 112 is coupled to the first and second set of solder balls 105 and 107. A capacitor 120 is coupled to the PCB 102. The capacitor 120 is located near the integrated package 100 on the PCB 102. The capacitor 120 may be used as a decoupling capacitor in a power distribution network.

One drawback of the integrated package 100 and the capacitor 120 shown in FIG. 1 is that it creates an integrated device with a form factor that may be too large for the needs of mobile computing devices. This may result in a package that is either too large and/or too thick. That is, the integrated package and the capacitor combination shown in FIG. 1 may be too thick and/or have a surface area that is too large to meet the needs and/or requirements of mobile, wearable or portable computing devices. For example, the placement of the capacitor 120 laterally to the integrated package 100 creates a surface area on the PCB 102 that may be too large to meet the needs mobile, wearable or portable computing devices.

Therefore, there is a need for an integrated device that includes a capacitor that utilizes less space while at the same time provides better capacitive capabilities. Ideally, such an integrated device will have a better form factor, while at the same time meeting the needs and/or requirements of mobile, wearable or portable computing devices.

SUMMARY

Various features, apparatus and methods described herein a package substrate that includes a capacitor, a redistribution layer, and a discrete coaxial connection.

A first example provides a package substrate that includes a first portion configured to operate as a capacitor, and a redistribution portion coupled to the first portion. The first portion includes a first dielectric layer, a first set of metal layers in the dielectric layer, and a first via in the dielectric layer. The first via is coupled to the first set of metal layers, where the first via and the first set of metal layers are configured to provide a first electrical path for a ground signal. The first portion also includes a second set of metal layers in the dielectric layer, and a second via in the dielectric layer. The second via is coupled to the second set of metal layers, where the second via and the second set of metal layers are configured to provide a second electrical path for a power signal. The redistribution portion includes a second dielectric layer, and a set of interconnects.

According to an aspect, the first portion further includes a third via, where a combination of the third via and at least a portion of the first set of metal layers is configured as a discrete coaxial connection in the first portion.

According to one aspect, the third via is configured to provide a third electrical path for an input/output (I/O) signal.

According to an aspect, the first set of metal layers is at least a first spacing away from the third via, and the second set of metal layers is at least a second spacing away from the third via, the second spacing is greater than the first spacing.

According to one aspect, the first set of metal layers at least partially surrounds the third via.

According to an aspect, the first dielectric layer includes a ceramic material.

According to one aspect, a die is coupled to the package substrate.

According to an aspect, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides a package substrate that includes a capacitive means and a redistribution portion coupled to the capacitive means. The capacitive means includes (i) a first electrical path means configured to provide a first electrical path for a ground signal, and (ii) a second electrical path means configured to provide a second electrical path for a power signal. The redistribution portion includes a second dielectric layer, and a set of interconnects.

According to an aspect, the capacitive means further includes a discrete coaxial connection means configured to provide a third electrical path.

According to one aspect, the discrete coaxial connection means is configured to provide the third electrical path for an input/output (I/O) signal.

According to an aspect, a die is coupled to the package substrate.

According to one aspect, the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a package substrate that includes a first dielectric layer, a first set of metal layers in the dielectric layer, a first via in the dielectric layer, and a second via in the dielectric layer. The first via is coupled to the first set of metal layers, where the first via and the first set of metal layers are configured to provide a first electrical path for a ground signal. A combination of the second via and at least a portion of the first set of metal layers is configured as a discrete coaxial connection in the package substrate.

According to an aspect, the second via is configured to provide a second electrical path for an input/output (I/O) signal.

According to one aspect, the second via is configured to provide a second electrical path for a power signal.

According to an aspect, the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a method for fabricating a package substrate comprising a capacitor. The method forms a first portion configured as the capacitor, where forming the first portion includes forming a first dielectric layer, forming a first set of metal layers in the dielectric layer, forming a first electrical path for a ground signal, where forming the first electrical path for the ground signal comprises forming a first via in the dielectric layer, and coupling the first via to the first set of metal layers, forming a second set of metal layers in the dielectric layer, forming a second electrical path for a power signal, where forming the second electrical path for the power signal further comprises forming a second via in the dielectric layer and coupling the second via to the second set of metal layers. The method also forms a redistribution portion on the first portion, where forming the redistribution portion includes forming a second dielectric layer, and forming a set of interconnects.

According to an aspect, forming the first portion further includes forming a third via, where a combination of the third via and at least a portion of the first set of metal layers is configured as a discrete coaxial connection in the first portion.

According to one aspect, the third via is configured to provide a third electrical path for an input/output (I/O) signal.

According to an aspect, the first set of metal layers is at least a first spacing away from the third via, and the second set of metal layers is at least a second spacing away from the third via, the second spacing is greater than the first spacing.

According to one aspect, the first set of metal layers at least partially surrounds the third via.

According to an aspect, the first dielectric layer includes a ceramic material.

According to one aspect, the method couples a die to the package substrate comprising the first portion and the redistribution portion.

According to an aspect, the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

FIG. 7 illustrates an example of a coaxial connection.

FIG. 8 illustrates an example of various electrical aspects of a coaxial connection.

FIG. 9 illustrates an example of a plan view of a coaxial connection.

FIG. 10 illustrates an example of a plan view of a coaxial connection.

DETAILED DESCRIPTION

Figure 1:
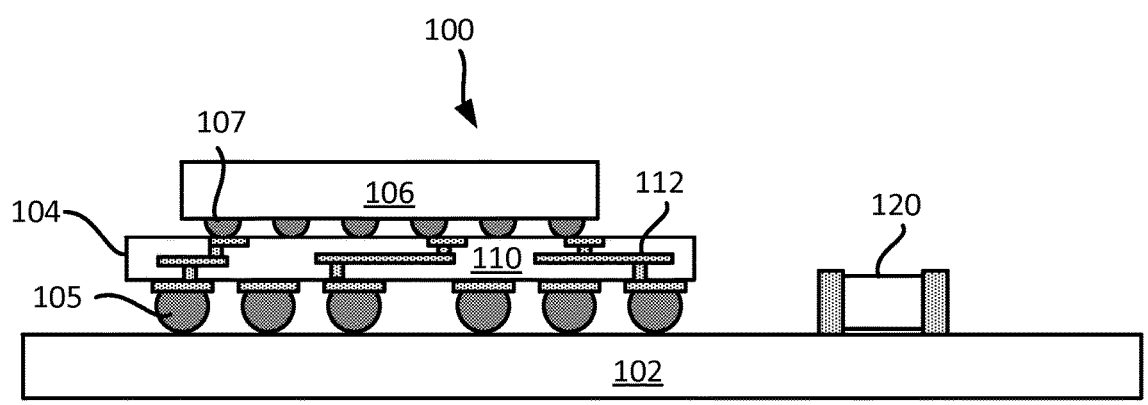
FIG. 1 illustrates a conventional integrated device package next to a capacitor.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a package substrate that includes a base portion (e.g., substrate portion, first portion) and a redistribution portion. The base portion is configured to operate as a capacitor. The base portion includes a first dielectric layer, a first set of metal layers in the dielectric layer, a first via in the dielectric layer, a second set of metal layers in the dielectric layer, and a second via in the dielectric layer. The first via is coupled to the first set of metal layers. The first via and the first set of metal layers are configured to provide a first electrical path for a ground signal. The second via is coupled to the second set of metal layers. The second via and the second set of metal layers are configured to provide a second electrical path for a power signal. The redistribution portion is coupled to the base portion. The redistribution portion includes a second dielectric layer, and a set of interconnects. In some implementations, the base portion includes a third via, wherein a combination of the third via and at least a portion of the first set of metal layers is configured as a discrete coaxial connection in the base portion. In some implementations, the third via is configured to provide a third electrical path for an input/output signal.

In some implementation, an interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

In some implementations, a redistribution layer (RDL or a redistribution metal layer) is a metal layer of a redistribution portion of an integrated device and/or a package substrate. A redistribution layer may include one or more redistribution interconnects, which are formed on the same metal layer of the redistribution portion. A redistribution portion of an integrated device and/or a package substrate may include several redistribution layers, each redistribution layer may include one or more redistribution interconnects. Thus, for example, a redistribution portion may include a first redistribution interconnect on a first redistribution layer, and a second redistribution interconnect on a second redistribution layer that is different than the first redistribution layer.

Figure 2:
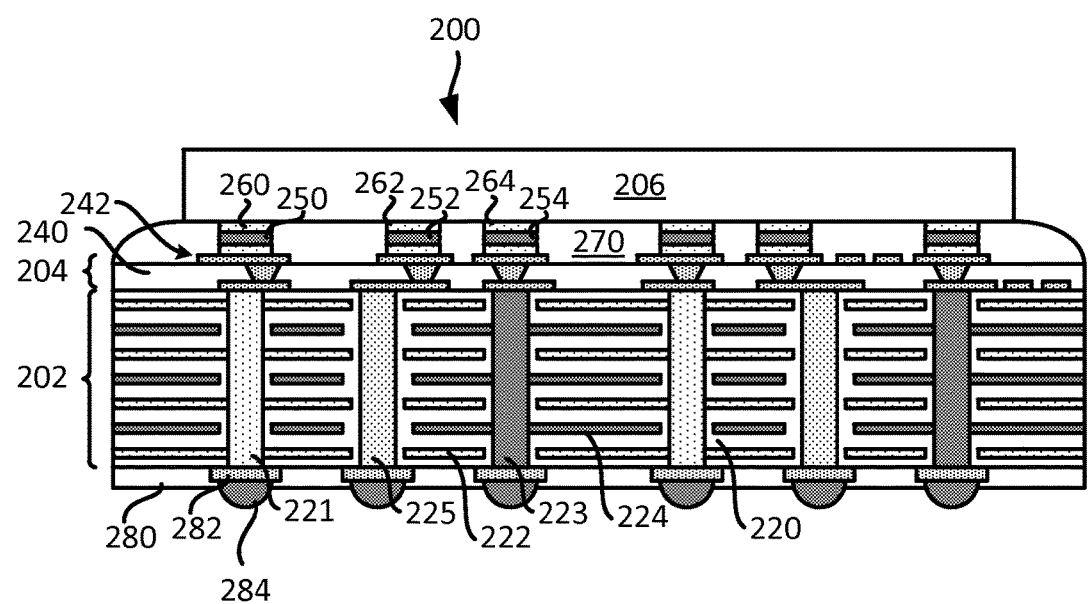
FIG. 2 illustrates an example of an integrated device package comprising a die coupled to a capacitor configured as a package substrate comprising a discrete coaxial connection.

Exemplary Integrated Device Package Comprising a Package Substrate Configured as a Capacitor FIG. 2 illustrates an example of an integrated device package 200 that includes a base portion 202 (e.g., substrate portion, first portion), a redistribution portion 204 and a die 206. The base portion 202 is configured to operate as a capacitor (e.g., capacitive means). In some implementations, a package substrate includes the base portion 202 and/or the redistribution portion 204.

The base portion 202 includes a set of dielectric layers 220, a first set of metal layers 222, a second set of metal layers 224, a first set of vias 221, a second set of vias 223, and a third set of vias 225. The base portion 202 may also includes a solder resist layer 280, a set of pads 282, and a set of solder balls 284.

The set of dielectric layers 220 may include one or more dielectric layers. In some implementations, the set of dielectric layers 220 may include a ceramic material. The first set of metal layers 222 and the second set of metal layers 224 are located in the set of dielectric layers 220. In some implementations, metal layers from the first set of metal layers 222 may be positioned in the set of dielectric layers 220 such that they vertically alternate with metal layers from the second set of metal layers 224. For example, a first metal layer (M1) may be from the first set of metal layers 222, a second metal layer (M2) may be from the second set of metal layers 224, a third metal layer (M3) may be from the first set of metal layers 222, a fourth metal layer (M4) may be from the second set of metal layers 224, and so on and so forth.

In some implementations, the set of dielectric layers 220, the first set of vias 221, the first set of metal layers 222, the second set of vias 223, and the second set of metal layers 224 may be configured to operate as a capacitor. Thus, in some implementations, the base portion 202 may integrate a fully functional capacitor. In some implementations, the capacitor occupies a majority, substantially all (e.g., about 80% or more), or all of the space in the base portion 202. Such an integration of a capacitor provides several technical advantages, such as large capacitance capabilities with very low inductance (ESL). Moreover, the integration of the capacitor as part of the base portion 202 provides excellent warpage control and/or mechanical stability of the base portion 202, since the addition of the metal layers in the base portion 202 helps increase the strength of the base portion 202. Moreover, the approach in the present disclosure is in contrast of embedding a pre-fabricated capacitor in a package substrate.

The first set of metal layers 222 may include several metal layers and/or metal plates in the set of dielectric layers 220. The first set of metal layers 222 is coupled (e.g., electrically coupled) to the first set of vias 221. In some implementations, the first set of vias 221 and the first set of metal layers 222 are configured to provide an electrical path for a ground reference signal (e.g., ground signal from the die 206).

The second set of metal layers 224 may include several metal layers and/or metal plates in the set of dielectric layers 220. The second set of metal layers 224 is coupled (e.g., electrically coupled) to the second set of vias 223. In some implementations, the second set of vias 223 and the second set of metal layers 224 are configured to provide an electrical path for a power signal (e.g., power signal to the die 206).

The third set of vias 225 traverses the set of dielectric layers 220. In some implementations, the third set of vias 225 is configured to provide an electrical path for an input/output (I/O) signal (e.g., I/O signal to/from the die 206). In some implementations, the third set of vias 225 in combination with at least portions of the first set of metal layers 222 may be configured as discrete coaxial connections (e.g., discrete coaxial connection means). An example of a discrete coaxial connection will be further described in detail in at least FIGS. 7-12 below. In addition, a more detailed description of the base portion 202 will be further described in FIG. 3 below.

In some implementations, the base portion is a first means (e.g., base means) configured to operate as a capacitor (e.g., capacitive means), where the first means includes (i) a first electrical path means (e.g., first set of vias 221 and first set of metal layers 222) configured to provide a first electrical path for a ground signal, and (ii) a second electrical path means (e.g., second set of vias 223 and second set of metal layers 224) configured to provide a second electrical path for a power signal. In some implementations, at least a majority of the metal layers in the base portion 202 and/or the package substrate is configured to operate as a capacitor (e.g., capacitive means).

The redistribution portion 204 includes a set of dielectric layers 240 and a set of redistribution interconnects 242. The redistribution portion 204 is coupled to the base portion 202. In some implementations, the redistribution portion 204 is part of the base portion 202. A more detailed description of the redistribution portion 204 will be further described in FIG. 3 below. A solder resist layer (not shown) may be formed over the redistribution portion 204.

The die 206 includes a first pillar 260, a second pillar 262, and a third pillar 264. The first, second, and third pillars 260, 262 and 264 are interconnects that provide one or more electrical paths to/from internal components and/or circuits of the die 206. The die 206 is coupled to the base portion 202 through the redistribution portion 204. For example, the die 206 is coupled to the set of interconnects 242 through solders 250, 252, and 254 and the first, second, third pillars 260, 262, and 264. In some implementations, other types of interconnects may be used to couple the die 206 to the base portion 202 through the redistribution portion 204.

FIG. 2 also illustrates an underfill 270 between the die 206 and the redistribution portion 204. As shown in FIG. 2, the underfill 270 covers at least the pillars 260, 262, and 264 and/or the solders 250, 252, and 254.

Figure 3:
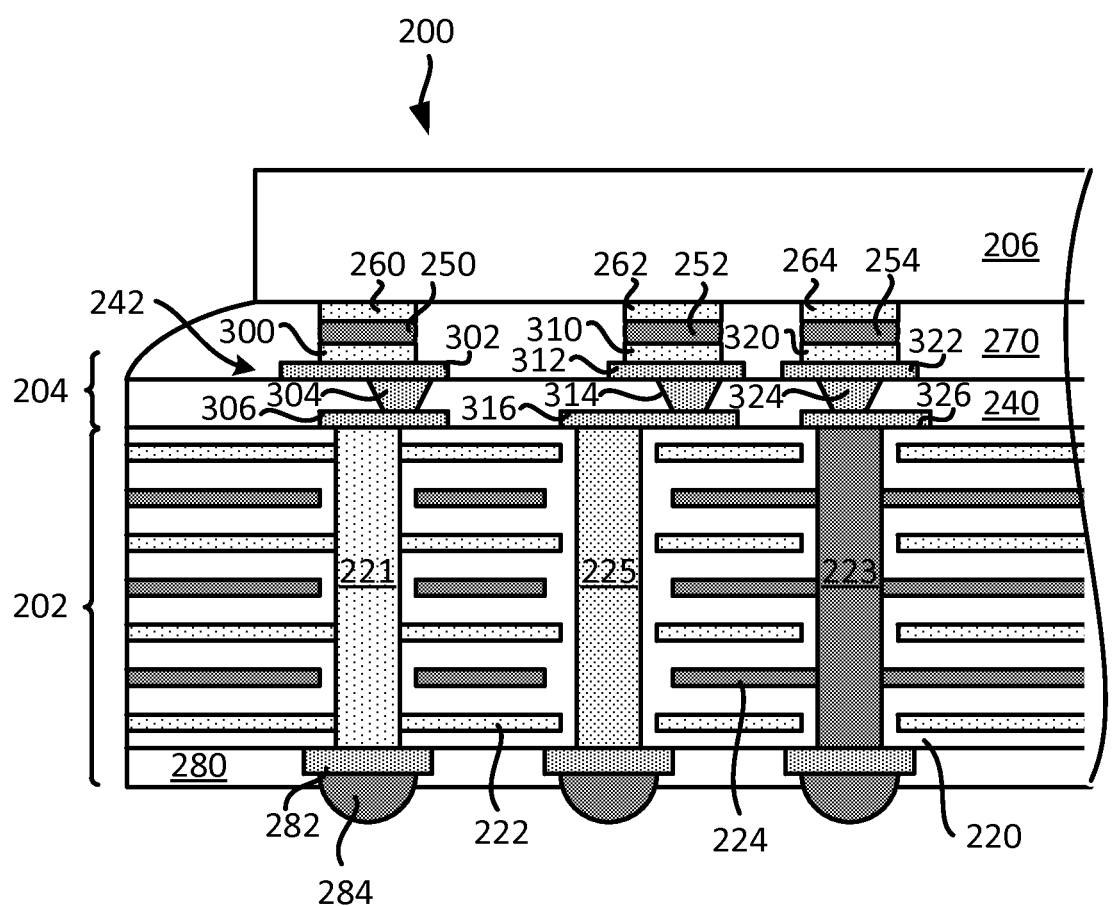
FIG. 3 illustrates an example of a close up view of a portion of an integrated device package comprising a die coupled to a capacitor configured as a package substrate comprising a discrete coaxial connection.

FIG. 3 illustrates a close up view of a portion of the integrated device package 200 of FIG. 2. As described above, the integrated device package 200 includes the base portion 202 (e.g., substrate portion, first portion), the redistribution portion 204 and the die 206. The base portion 202 is configured to operate as a capacitor (e.g., capacitive means). In some implementations, a package substrate includes the base portion 202 and/or the redistribution portion 204.

As shown in FIG. 3, the redistribution portion 204 includes the set of dielectric layers 240 and the set of redistribution interconnect 242. In some implementations, the set of redistribution interconnects 242 includes a first interconnect 300 (e.g., pad, trace), a second interconnect 302 (e.g., pad, trace), a third interconnect 304 (e.g., via), a fourth interconnect 306, a first interconnect 310 (e.g., pad, trace), a second interconnect 312 (e.g., pad, trace), a third interconnect 314 (e.g., via), a fourth interconnect 316, a first interconnect 320 (e.g., pad, trace), a second interconnect 322 (e.g., pad, trace), a third interconnect 324 (e.g., via), and a fourth interconnect 326. In some implementations, the first interconnects 300, 310, and/or 320 may be optional.

As further shown in FIG. 3, the die 206 is coupled to the base portion 202 through the redistribution portion 204. For example, the first pillar 260 of the die 206 is coupled to the solder 250, the first interconnect 300 (e.g., pad, trace), the second interconnect 302, the third interconnect 304 (e.g., via), the fourth interconnect 306, and/or the first set of vias 221. The first interconnect 300 may be optional. In such instances, the solder 250 may be coupled (e.g., directly coupled) to the interconnect 302. In some implementations, the first pillar 260, the solder 250, the first interconnect 300, the second interconnect 302, the third interconnect 304, the fourth interconnect 306, and/or the first set of vias 221 are configured to provide an electrical path for a ground reference signal.

In another example, the second pillar 262 of the die 206 is coupled to the solder 252, the first interconnect 310 (e.g., pad, trace), the second interconnect 312, the third interconnect 314 (e.g., via), the fourth interconnect 316, and/or the second set of vias 223. The first interconnect 310 may be optional. In such instances, the solder 252 may be coupled (e.g., directly coupled) to the interconnect 312. In some implementations, the second pillar 262, the solder 252, the first interconnect 310, the second interconnect 312, the third interconnect 314, the fourth interconnect 316, and/or the second set of vias 223 are configured to provide an electrical path for a power signal.

In yet another example, the third pillar 264 of the die 206 is coupled to the solder 254, the first interconnect 320 (e.g., pad, trace), the second interconnect 322, the third interconnect 324 (e.g., via), the fourth interconnect 326, and/or the third set of vias 225. The first interconnect 320 may be optional. In such instances, the solder 254 may be coupled (e.g., directly coupled) to the interconnect 322. In some implementations, the third pillar 264, the solder 254, the first interconnect 320, the second interconnect 322, the third interconnect 324, the fourth interconnect 326, and/or the third set of vias 225 are configured to provide an electrical path for an input/output (I/O) signal. In some implementations, the third set of vias 225 in combination with at least portions of the first set of metal layers 222 may be configured as discrete coaxial connections. An example of a discrete coaxial connection will be further described in detail in at least FIGS. 7-12 below.

Figure 4:
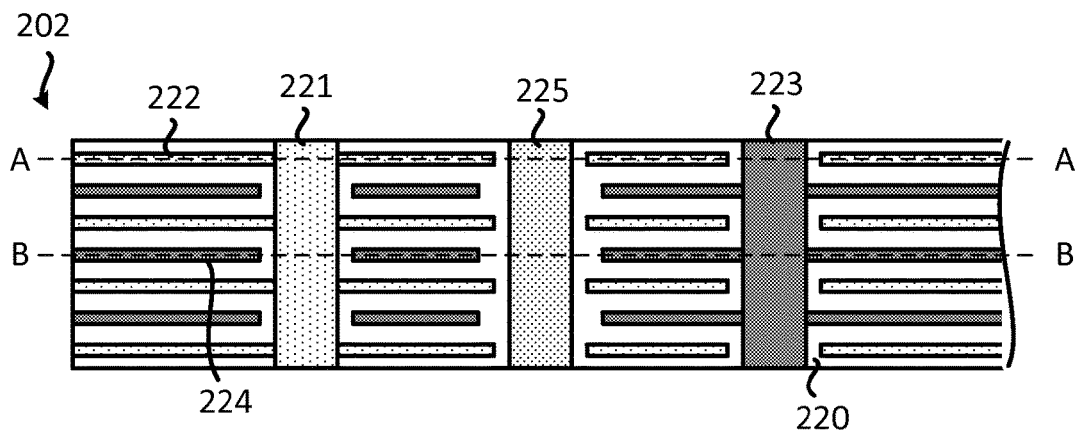
FIG. 4 illustrates an example of profile view of a portion of a capacitor configured as a package substrate comprising a discrete coaxial connection.

FIG. 4 illustrates a profile view of a portion of the base portion 202 (e.g., substrate portion, first portion) that includes the set of dielectric layers 220, the first set of vias 221, the first set of metal layers 222, the second set of vias 223, the second set of metal layers 224, and the third set of vias 225. FIG. 4 also illustrates a first cross-section line AA that traverses through a portion of the base portion 202. FIG. 4 further illustrates a second cross-section line BB that traverses through another portion of the base portion 202.

Figure 5:
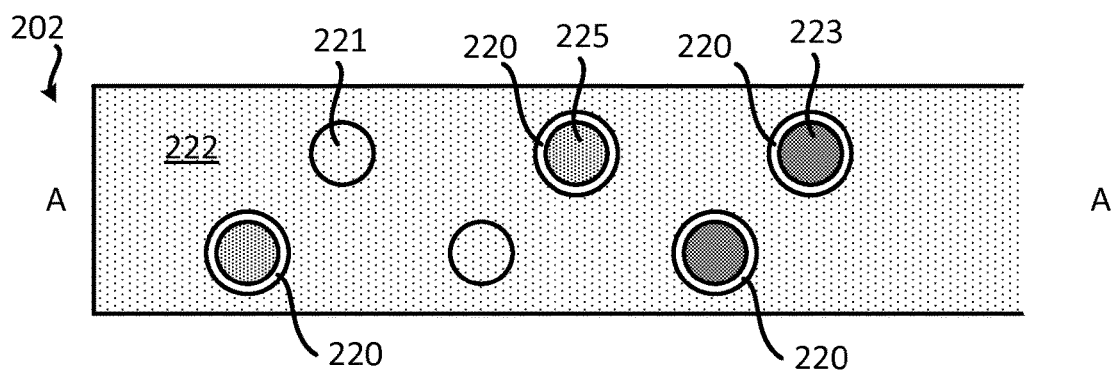
FIG. 5 illustrates an example of a plan view of a portion of a capacitor configured as a package substrate comprising a discrete coaxial connection.

FIG. 5 illustrates a plan view of the base portion 202 (e.g., substrate portion, first portion) through the cross-section AA. Specifically, FIG. 5 illustrates a plan view across a metal layer (e.g., metal plate) of the first set of metal layers 222. In some implementations, the first set of metal layers 222 is configured to provide an electrical path for a ground reference signal. As shown in FIG. 5, the metal layer from the first set of metal layers 222 is coupled (e.g., electrically coupled) to the first set of vias 221. FIG. 5 also illustrates that the set of dielectric layers 220 separates the metal layer (from the first set of metal layers 222) from the second and third set of vias 223 and 225.

Figure 6:
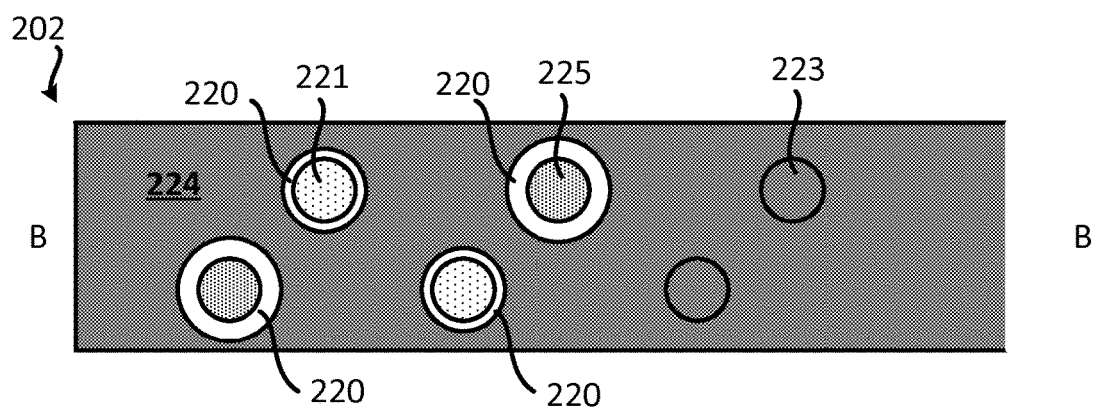
FIG. 6 illustrates an example of another plan view of a portion of a capacitor configured as a package substrate comprising a discrete coaxial connection.

FIG. 6 illustrates a plan view of the base portion 202 through the cross-section BB. Specifically, FIG. 6 illustrates a plan view across a metal layer (e.g., metal plate) of the second set of metal layers 224. In some implementations, the second set of metal layers 224 is configured to provide an electrical path for a power signal. As shown in FIG. 6, the metal layer from the second set of metal layers 224 is coupled (e.g., electrically coupled) to the second set of vias 223. FIG. 6 also illustrates that the the set of dielectric layers 220 separates the metal layer (from the second set of metal layers 224) from the first and third set of vias 221 and 225. FIG. 6 illustrates that a first spacing between the metal layer 224 and the via 225 is greater than a second spacing between the metal layer 224 and the via 221.

Exemplary Aspects of a Coaxial Connection

A coaxial connection provide several advantages over traditional interconnects. For example, coaxial connections provide better signal integrity and signal performance than traditional interconnects. FIGS. 7-10 illustrate various aspects of coaxial connections. Specifically, FIG. 7 shows a view of an exemplary coaxial connection 700. The coaxial connection 700 includes a first interconnect 702 (e.g., inner interconnect), a dielectric layer 704, and a second interconnect 706 (e.g., outer interconnect). The dielectric layer 704 provides a spacing between the first interconnect 702 and the second interconnect 706. The second interconnect 706 surrounds the first interconnect 702. In some implementations, the first interconnect 702 is configured to provide a first electrical path in a first direction for a signal (e.g., I/O signal). In some implementations, the second interconnect 706 is configured to provide a second electrical path in a second direction for a ground reference signal, where the second direction is different than the first direction.

FIG. 8 shows a view of various electrical aspects of the exemplary coaxial connection 700. The first interconnect 702 may be configured to conduct a first electrical signal (e.g., a I/O signal) in a first direction 802 (e.g., from top to bottom). The second interconnect 706 may be configured to conduct a second electrical signal (e.g., a ground signal) in a second direction 806 (e.g., from bottom to top). As illustrated in FIG. 8, the second direction 806 may be different from the first direction 802. The dielectric layer 704 may have a capacitance 810, and a magnetic field 812 may exist between the first interconnect 702 and the second interconnect 706. The capacitance 810 and the magnetic field 812 will be further described in detail in FIG. 10.

FIG. 9 shows a plan view of the exemplary coaxial connection 700. The first exemplary coaxial connection 700 includes the first interconnect 702, and the dielectric layer 704, and the second interconnect 706. In the example of FIG. 9, the second interconnect 706 may be a plate shape interconnect that surrounds the first interconnect 702, but is separated by the dielectric layer 704.

FIG. 10 shows a plan view (e.g. top view) of various electrical aspects of the exemplary coaxial connection 700. The dielectric layer 704 may be located between two interconnects (e.g., the first interconnect 702 and the second interconnect 706). Accordingly, there may have a capacitance 810 between the first interconnect 702 and the second interconnect 706. Generally, capacitance is directly proportional to the surface area of the interconnect plates (e.g., the circumference of the first interconnect 702 and the circumference of the second interconnect 706) and inversely proportional to the separation distance between the plates (e.g., the thickness of the dielectric layer 704). Also, the capacitance may be a function of the permittivity of the dielectric (e.g., the dielectric layer 704).

Because the dielectric layer 704 is located between two interconnects (e.g., the first interconnect 702 and the second interconnect 706), a magnetic field 812 may exist between the two interconnects (e.g., between the first interconnect 702 and the second interconnect 706). For example, if the current in the first interconnect 702 is traveling downwards (e.g., into the page), then the magnetic field 812 will be in a clockwise direction, as illustrated in FIG. 10.

Figure 11:
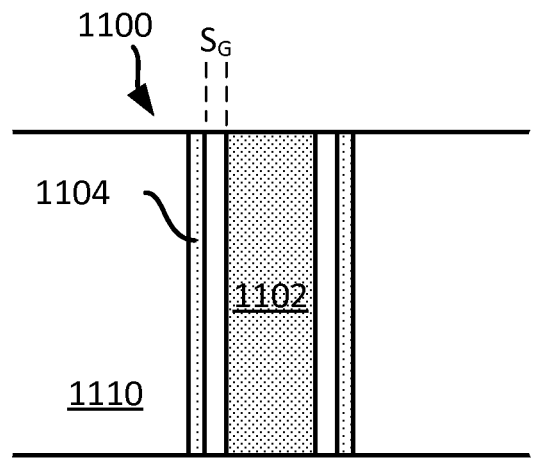
FIG. 11 illustrates an example of a continuous coaxial connection in a package substrate.

A coaxial connection can include a continuous coaxial connection or a discrete coaxial connection. FIG. 11 illustrates an example of a continuous coaxial connection 1100, and FIG. 12 illustrates an example of a discrete coaxial connection 1200.

FIG. 11 illustrates an example of a continuous coaxial connection 1100 in a dielectric layer 1110 (e.g., dielectric layer of a package substrate). The dielectric layer 1110 may include one or more dielectric layers. The continuous coaxial connection 1100 includes a via 1102 that vertically traverses the dielectric layer 1110. The continuous coaxial connection 1100 also includes an interconnect 1104 that also vertically traverses the dielectric layer 1110. The interconnect 1104 is separated by a spacing $S_G$ from the via 1102. The interconnect 1104 surrounds the via 1102. In some implementations, the via 1102 is configured to provide an electrical path for a signal (e.g., I/O signal). In some implementations, the interconnect 1104 is configured to provide an electrical path for a ground reference signal. The continuous coaxial connection 1100 is continuous because the interconnect 1104 continuously traverses the dielectric layer 1110.

Figure 12:
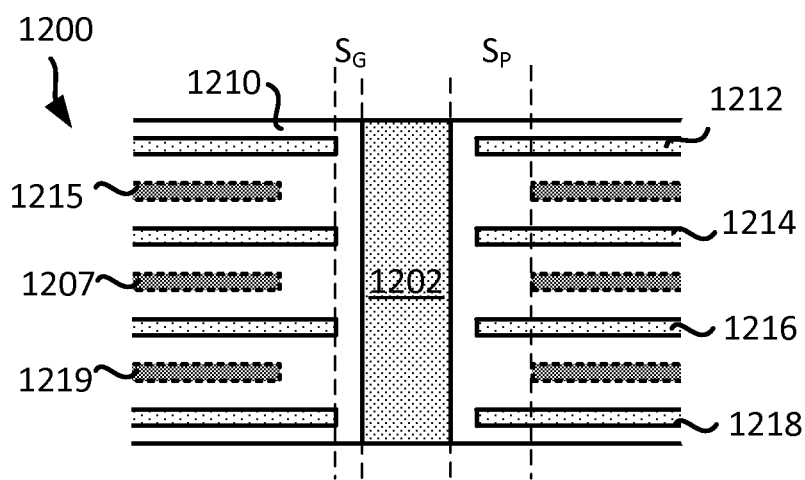
FIG. 12 illustrates an example of a discrete coaxial connection in a package substrate.

FIG. 12 illustrates an example of a discrete coaxial connection 1200 in a dielectric layer 1210 (e.g., dielectric layer of a package substrate). The dielectric layer 1210 may include one or more dielectric layers. In some implementations the discrete coaxial connection 1200 is a discrete coaxial connection means. The discrete coaxial connection 1200 includes a via 1202 that vertically traverses the dielectric layer 1210. The discrete coaxial connection 1200 also includes portions of metal layers 1212, 1214, 1216 and/or 1218. In some implementations, the metal layers 1212, 1214, 1216 and 1218 are metal plates of a capacitor, as described in at least FIGS. 2-3. The metal layers 1212, 1214, 1216, and 1218 are separated by a spacing $S_G$ from the via 1202. metal layers 1212, 1214, 1216, and 1218 surround the via 1202. In some implementations, the via 1202 is configured to provide a first electrical path for a signal (e.g., I/O signal). In some implementations, the metal layers 1212, 1214, 1216, 1218 are configured to provide a second electrical path for a ground reference signal. The dielectric layer 1210 also includes metal layers 1215, 1217, and 1219. The metal layers 1215, 1217, and 1219 may be configured to provide a third electrical path for a power signal. As shown in FIG. 12, the metal layers 1215, 1217, and 1219 are separated by a spacing Sp from the via 1202. The spacing Sp is greater than the spacing $S_G$.

In some implementations, portions of the metal layers 1212, 1214, 1216 and 1218 are configured to provide an 'interconnect' in a similar manner as the interconnect 1104 of FIG. 11. Specifically, in some implementations, portions of the metal layers 1212, 1214, 1216 and 1218 that do not overlap with the metal layers 1215, 1217, and 1219 may be configured to operate in a similar manner as the interconnect 1104 of FIG. 11. In some implementations, portions of the metal layers 1212, 1214, 1216 and 1218 are configured to operate as a discrete interconnect that traverses the dielectric layer 1210. Thus, the combination of at least portions of the metal layers 1212, 1214, 1216, and 1218 and the via 1202 form a discrete coaxial connection in the dielectric layer 1210 (e.g., dielectric layer of a capacitor and/or a package substrate). Such a discrete coaxial connection may operate in a manner as described in at least FIGS. 7-10, even through portions of the discrete coaxial connection are non-continuous. The coaxial connection (e.g., continuous coaxial connection 1100, discrete coaxial connection 1200) described in FIGS. 11 and 12 may be implemented in the integrated device packages of FIGS. 2-6, and/or any other integrated device package of the present disclosure.

Figure 13A:
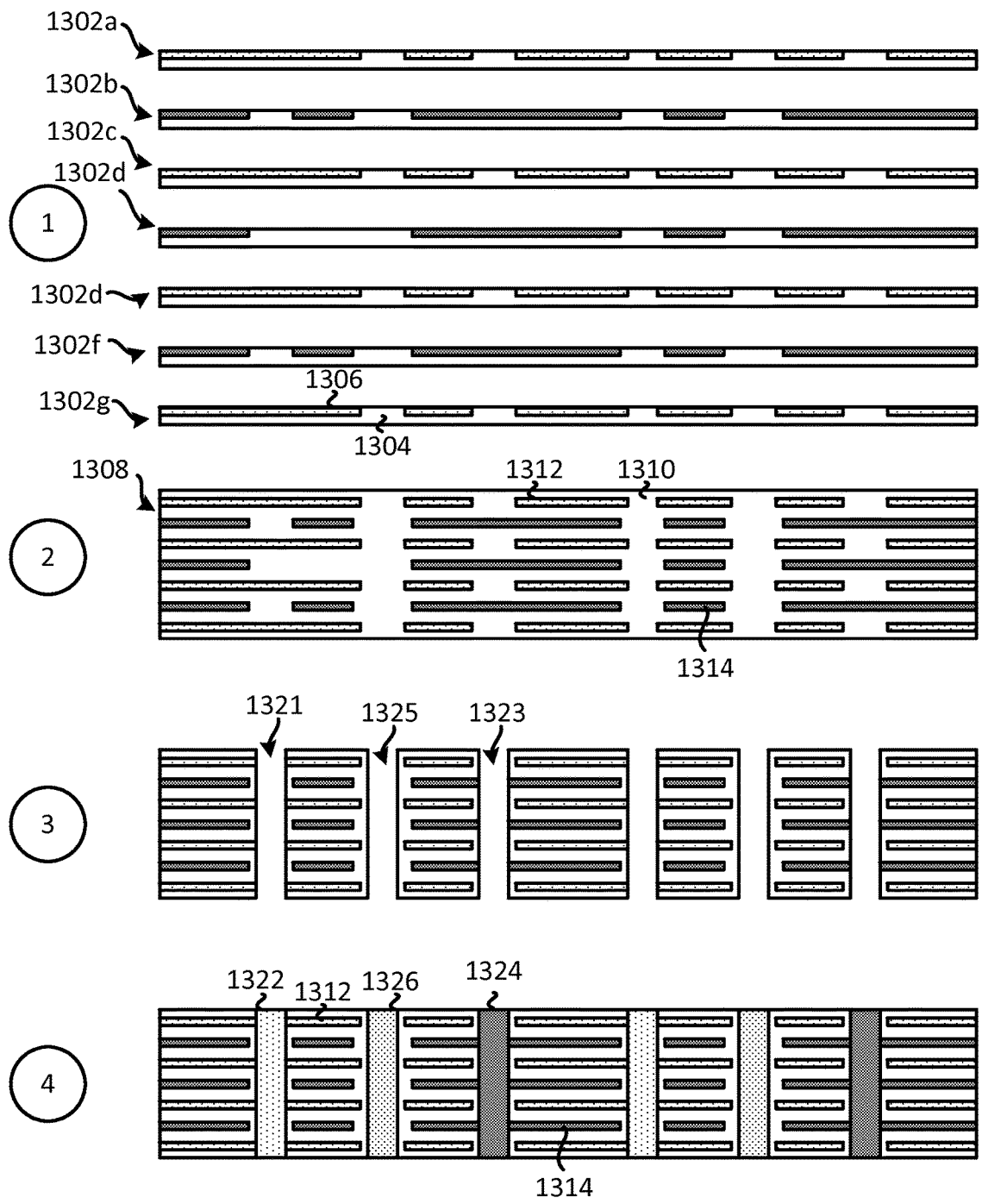
FIG. 13 (comprising FIGS. 13A-13C) illustrates an exemplary sequence for providing/fabricating an integrated device package comprising a die coupled to a capacitor configured as a package substrate comprising a discrete coaxial interconnect.
Figure 13B:
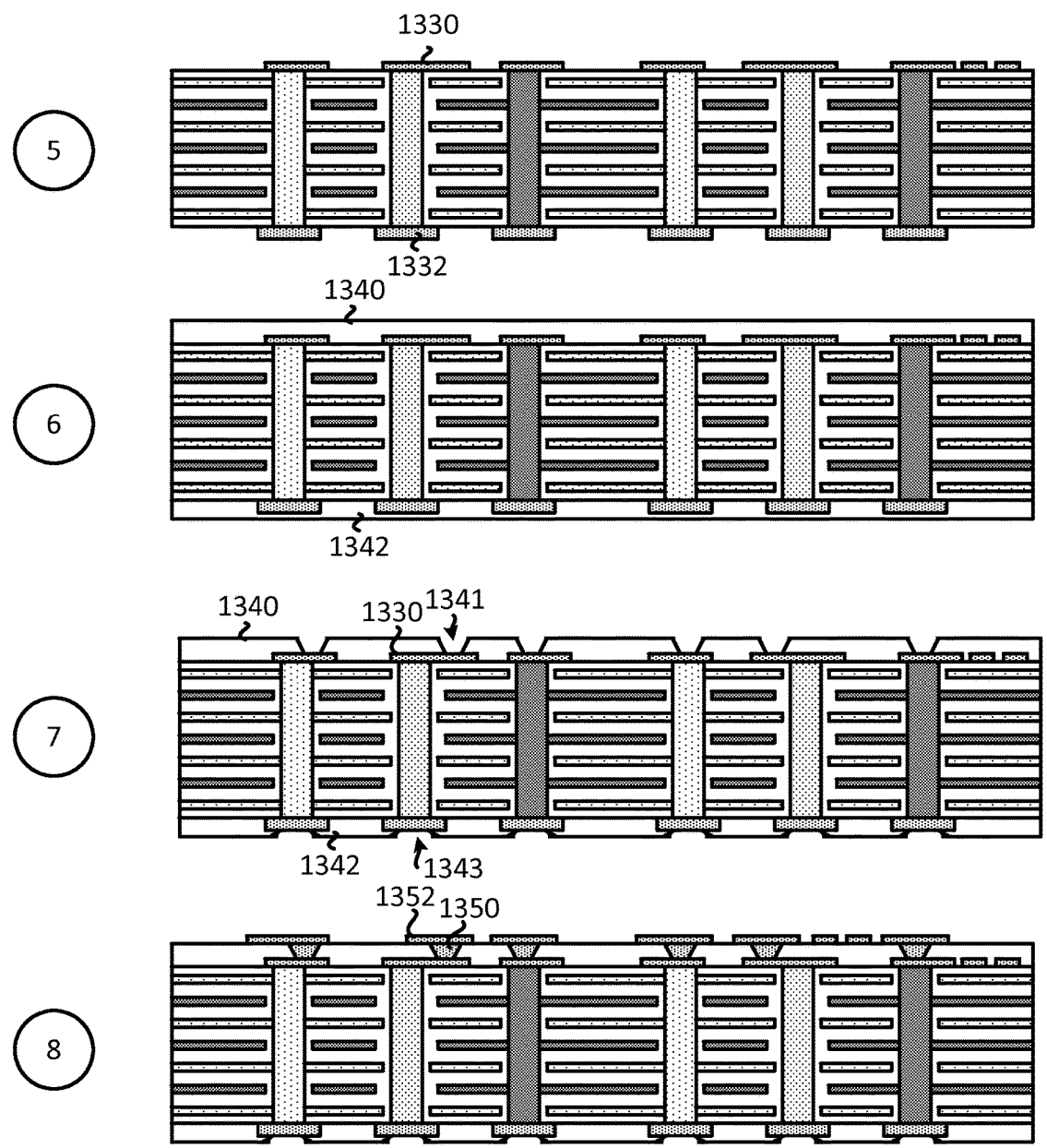

Exemplary Sequence for Providing/Fabricating an Integrated Device Package Comprising a Package Substrate Configured as a Capacitor In some implementations, providing/fabricating an integrated device package that includes a package substrate configured as a capacitor includes several processes. FIG. 13 (which includes FIGS. 13A-13C) illustrates an exemplary sequence for providing/fabricating an integrated device package that includes a package substrate configured as a capacitor. In some implementations, the sequence of FIGS. 13A-13C may be used to provide/fabricate the integrated device package of FIGS. 2 and 3 and/or other integrated device packages in the present disclosure. However, for the purpose of simplification, FIGS. 13A-13C will be described in the context of providing/fabricating the integrated device package of FIG. 2.

It should be noted that the sequence of FIGS. 13A-13C may combine one or more stages in order to simplify and/or clarify the sequence for providing an integrated device package. In some implementations, the order of the processes may be changed or modified.

Stage 1 of FIG. 13A, illustrates a state after several sheets 1302 (sheets 1302a-g) are provided/fabricated. Each sheet includes a dielectric layer (e.g., ceramic layer) and a metal layer. Different sheets may include a metal layer with a different pattern design. For example, sheet 1302g may include a dielectric layer 1304 (e.g., ceramic layer) and a metal layer 1306. The metal layer 1306 may have a particular pattern in the dielectric layer 1304. In some implementations, the metal layer 1306 is formed on the dielectric layer 1304 using a screen printing process.

Stage 2 illustrates a state after the several sheets 1302 are combined (e.g., laminated together) to form a base 1308 (e.g., base portion, first portion). The base 1308 includes a dielectric layer 1310, a first set of metal layers 1312 (e.g., first set of metal plates) and a second set of metal layers 1314 (e.g., second set of metal plates). In some implementations, the dielectric layer 1310 is a combination of some or all of the dielectric layers of the sheets 1302*a-g*. The dielectric layer 1310 may include several dielectric layers.

Stage 3 illustrates a state after several cavities are formed in the base 1308. Different implementations may use different processes to form the cavities (e.g., cavities 1321, 1323, 1325). In some implementations, a laser is used to form the cavities. In some implementations, a photo-etching process may be used to form the cavities in the base 1308.

Stage 4 illustrates a state after vias (e.g., vias 1322, 1324, 1326) are formed in the cavities of the base 1308. Different implementations may use different processes to form the vias. In some implementations, the vias are formed using a plating process or a paste process. Examples of plating processes are described in FIGS. 15-18. As shown in stage 4, a first via 1322 is formed in the base 1308 such that the first via 1322 is coupled to the first set of metal layers 1312. In some implementations, the first via 1322 and the first set of metal layers 1312 are configured to provide a first electrical path for a ground reference signal. The second via 1324 is formed in the base 1308 such that the second via 1324 is coupled to the second set of metal layers 1314. In some implementations, the second via 1324 and the second set of metal layers 1314 are configured to provide a second electrical path for a power signal. In some implementations, the third via 1326 and at least portions of the first set of metal layers 1312 are configured to operate as a discrete coaxial connection, as previously described in FIGS. 7-12.

Stage 5 of FIG. 13B, illustrates a state after a first metal layer 1330 and a second metal layer 1332 are formed on the base 1308. The first metal layer 1330 is formed on a first surface (e.g., top surface) of the base 1308. The second metal layer 1332 is formed on a second surface (e.g., bottom surface) of the base 1308. In some implementations, portions of the first metal layer 1330 and/or the second metal layer 1332 may define one or more interconnects (e.g, traces, pads). In some implementations, providing the first metal layer 1330 and/or the second metal layers 1332 include forming (e.g., plating) one or more metal layers (e.g., seed layer and metal layer) and selectively etching portions of the one or more metal layers. FIGS. 15-18 illustrate examples of providing one or more metal layers using several plating processes.

Stage 6 illustrates a state after a first dielectric layer 1340 and a second dielectric layer 1342 (e.g., solder resist layer) is formed on the base 1308. The first dielectric layer 1340 is formed over the first metal layer 1330 and the first surface of the base 1308. In some implementations, the first metal layer 1330 and the first dielectric layer 1340 form a redistribution portion of a package substrate. The second dielectric layer 1342 is formed over the second metal layer 1332 and the second surface of the base 1308.

Stage 7 illustrates a state after cavities are formed in the first dielectric layer 1340 and the second dielectric layer 1342. Specifically, a first set of cavities (e.g., cavity 1341) is formed in the first dielectric layer 1340, and a second set of cavities (e.g., cavity 1343) is formed in the second dielectric layer 1342.

Stage 8 illustrates a state after interconnects are formed on the first dielectric layer 1340. Specifically, stage 8 illustrates after vias (e.g., via 1350) and interconnects (e.g., interconnect 1352) are formed on/in the first dielectric layer 1340. Different implementations may form the interconnects differently. In some implementations, providing the interconnects (e.g., vias, traces, pads) includes forming (e.g., plating) one or more metal layers (e.g., seed layer and metal layer) and selectively etching portions of the one or more metal layers. FIGS. 15-18 illustrate examples of providing one or more metal layers using several plating processes. In some implementations, the first metal layer 1330, the first dielectric layer 1340, the via 1350, and the interconnect 1352 form a redistribution portion of a package substrate.

Stage 9 of FIG. 13C, illustrates a state after pads and/or traces (e.g., pad 1360) are formed on the interconnects (e.g., interconnect 1352). Different implementations may form the pads and/or traces differently. In some implementations, providing the pads and/or traces include forming (e.g., plating) one or more metal layers (e.g., seed layer and metal layer) and selectively etching portions of the one or more metal layers. FIGS. 15-18 illustrate examples of providing one or more metal layers using several plating processes. In some implementations, stage 9 may be optional.

Stage 10 illustrates a state after a die 1370 is coupled to the base 1308. The die 1370 includes a pillar 1372. The die 1370 is coupled to the base 1308 through the pillar 1372, a solder 1374, the pad 1360 (optional), the interconnect 1352, and the via 1350, and the first metal layer 1330. In some implementations, the die 1370 is coupled to the base 1308 through the redistribution portion.

Stage 11 illustrates a state after an underfill 1380 is provided, and solder 1392 is provided on the base 1308. The underfill 1380 is provided between the die 1370 and the dielectric layer 1340. The solder 1392 is coupled to at least a portion of the second metal layer 1332. As shown in stage 11, the solder 1392 is provided on the second surface of the base 1308.

Figure 14:
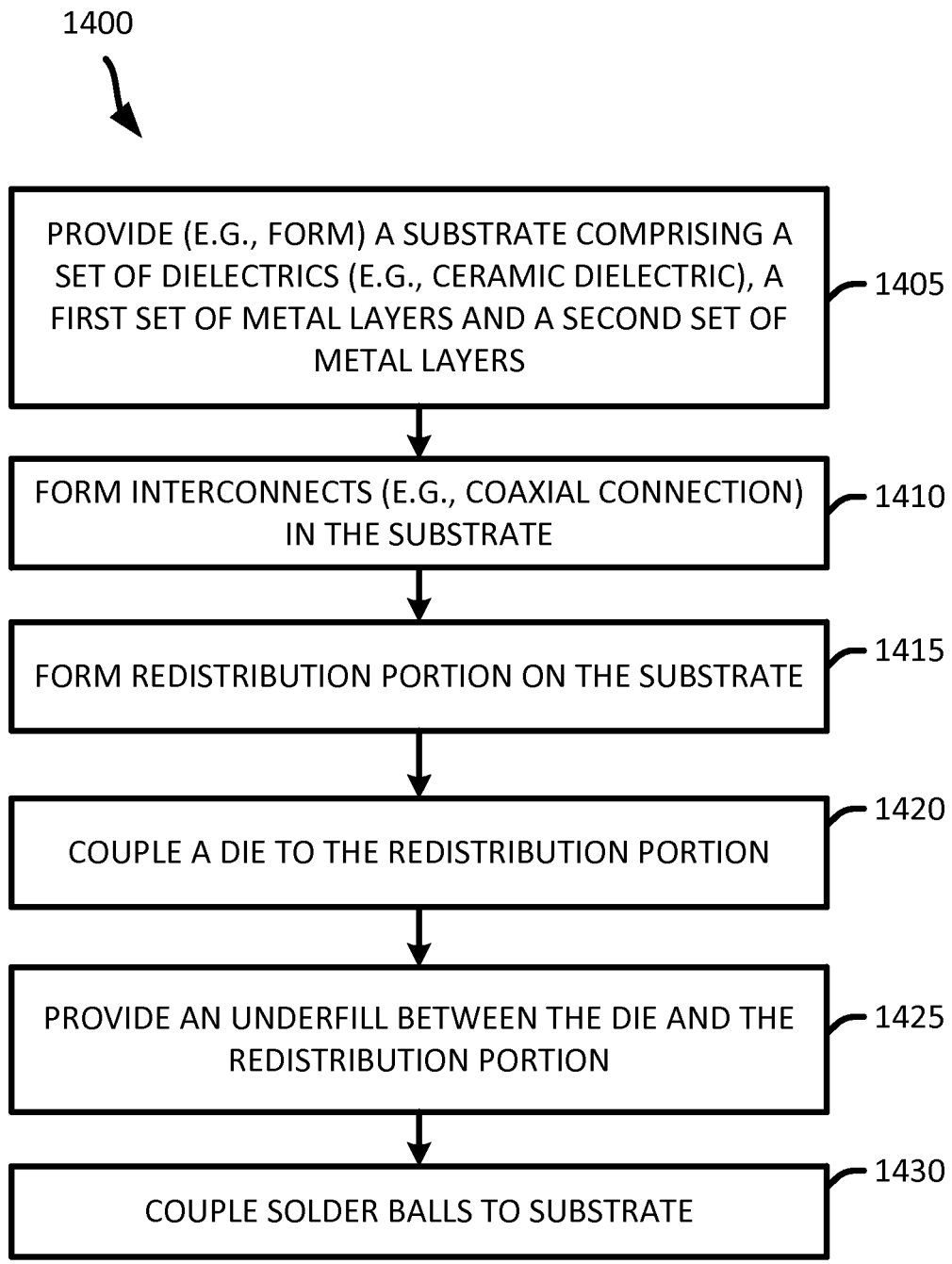
FIG. 14 illustrates an exemplary flow diagram of a method for providing/fabricating an integrated device package comprising a die coupled to a capacitor configured as a package substrate comprising a discrete coaxial interconnect.

Exemplary Method for Providing/Fabricating an Integrated Device Package Comprising a Package Substrate Configured as a Capacitor FIG. 14 illustrates an exemplary flow diagram of a method 1400 for providing/fabricating an integrated device package that includes a package substrate configured as a capacitor. In some implementations, the method of FIG. 14 may be used to provide/fabricate the integrated device package of FIG. 2 and/or other integrated device packages in the present disclosure.

It should be noted that the flow diagram of FIG. 14 may combine one or more step and/or processes in order to simplify and/or clarify the method for providing an integrated device package. In some implementations, the order of the processes may be changed or modified.

The method provides (at 1405) a package substrate that includes a set of dielectrics, a first set of metal layers and, and a second set of metal layers. For example, the method may provide several sheets that includes one or more dielectric layers and metal layers, and combine (e.g., laminate) the sheets to form a base (e.g., base portion, first portion) and/or package substrate. The dielectric layer may include a ceramic material. Stages 1 and 2 illustrate an example of providing (at 1405) a package substrate that includes a set of dielectrics, a first set of metal layers and, and a second set of metal layers.

The method then forms (at 1410) interconnects (e.g., vias) in the package substrate. In some implementations, forming the interconnects (e.g., vias) in the package substrate includes forming cavity in a base and filing the cavity with one or more metal conducting layers. In some implementations, a laser is used to form the cavities. In some implementations, a photo-etching process may be used to form the cavities in the base. Different implementations may use different processes to form the vias. In some implementations, the vias are formed using a plating process or a paste process. Examples of plating processes are described in FIGS. 15-18.

In some implementations, a first via is formed in the base such that the first via is coupled to the first set of metal layers. In some implementations, the first via and the first set of metal layers are configured to provide a first electrical path for a ground reference signal. The second via is formed in the base such that the second via is coupled to the second set of metal layers. In some implementations, the second via and the second set of metal layers are configured to provide a second electrical path for a power signal. In some implementations, the third via and portions of the first set of metal layers are configured to operate as a discrete coaxial connection, as previously described in FIGS. 7-12.

The method forms (at 1415) a redistribution portion on the base and/or package substrate. In some implementations, forming the redistribution portion includes forming one or more interconnects and one or more dielectric layers on the base and/or package substrate. Stages 5-8 of FIG. 13B illustrates an example of providing a redistribution portion.

Stage 9 of FIG. 13C, illustrates a state after pads and/or traces (e.g., pad 1360) are formed on the interconnects (e.g., interconnect 1352). Different implementations may form the pads and/or traces differently. In some implementations, providing the pads and/or traces include forming (e.g., plating) one or more metal layers (e.g., seed layer and metal layer) and selectively etching portions of the one or more metal layers. FIGS. 15-18 illustrate examples of providing one or more metal layers using several plating processes.

The method couples (at 1420) a die to a redistribution portion. In some implementations, the die is coupled to the redistribution portion through a pillar, a solder, and/or a pad. However, different implementations may couple the die to the redistribution portion differently. Stage 10 of FIG. 13C illustrates an example of coupling a die to a redistribution portion.

The method provides (at 1425) an underfill between the die and the redistribution portion. Stage 11 of FIG. 13C illustrates an example of providing an underfill between the die and the redistribution portion.

The method further couples (at 1430) solder balls to the package substrate. Stage 11 of FIG. 13 illustrates an example of coupling solder balls to the package substrate.

Exemplary Semi-Additive Patterning (SAP) Process

Various interconnects (e.g., traces, vias, pads) are described in the present disclosure. These interconnects may be formed in the package substrate and/or the redistribution portion of the integrated device package. In some implementations, these interconnects may includes one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes.

Different implementations may use different processes to form and/or fabricate the metal layers (e.g., interconnects, redistribution layer, under bump metallization layer, protrusion). In some implementations, these processes include a semi-additive patterning (SAP) process and a damascene process. These various different processes are further described below.

Figure 15:
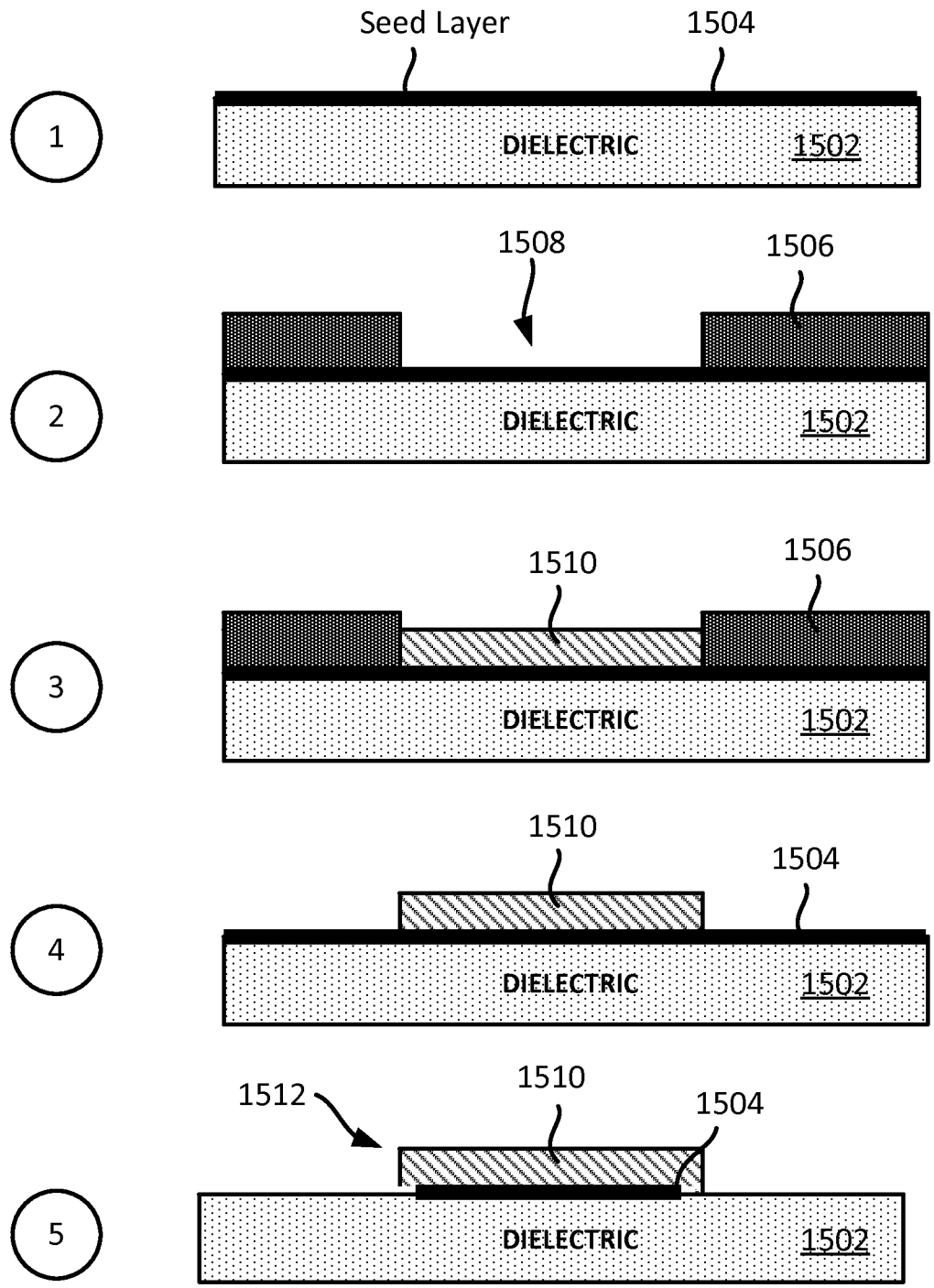
FIG. 15 illustrates an example of a semi-additive patterning (SAP) process.

FIG. 15 illustrates a sequence for forming an interconnect using a semi-additive patterning (SAP) process to provide and/or form an interconnect in one or more dielectric layer(s). As shown in FIG. 15, stage 1 illustrates a state of an integrated device (e.g., substrate) after a dielectric layer 1502 is provided (e.g., formed). In some implementations, stage 1 illustrates that the dielectric layer 1502 includes a first metal layer 1504. The first metal layer 1504 is a seed layer in some implementations. In some implementations, the first metal layer 1504 may be provided (e.g., formed) on the dielectric layer 1502 after the dielectric layer 1502 is provided (e.g., received or formed). Stage 1 illustrates that the first metal layer 1504 is provided (e.g., formed) on a first surface of the dielectric layer 1502. In some implementations, the first metal layer 1504 is provided by using a deposition process (e.g., PVD, CVD, plating process).

Stage 2 illustrates a state of the integrated device after a photo resist layer 1506 (e.g., photo develop resist layer) is selectively provided (e.g., formed) on the first metal layer 1504. In some implementations, selectively providing the resist layer 1506 includes providing a first resist layer 1506 on the first metal layer 1504 and selectively removing portions of the resist layer 1506 by developing (e.g., using a development process). Stage 2 illustrates that the resist layer 1506 is provided such that a cavity 1508 is formed.

Stage 3 illustrates a state of the integrated device after a second metal layer 1510 is formed in the cavity 1508. In some implementations, the second metal layer 1510 is formed over an exposed portion of the first metal layer 1504. In some implementations, the second metal layer 1510 is provided by using a deposition process (e.g., plating process).

Stage 4 illustrates a state of the integrated device after the resist layer 1506 is removed. Different implementations may use different processes for removing the resist layer 1506.

Stage 5 illustrates a state of the integrated device after portions of the first metal layer 1504 are selectively removed. In some implementations, one or more portions of the first metal layer 1504 that is not covered by the second metal layer 1510 is removed. As shown in stage 5, the remaining first metal layer 1504 and the second metal layer 1510 may form and/or define an interconnect 1512 (e.g., trace, vias, pads) in an integrated device, a redistribution portion and/or a substrate. In some implementations, the first metal layer 1504 is removed such that a dimension (e.g., length, width) of the first metal layer 1504 underneath the second metal layer 1510 is about the same or smaller than a dimension (e.g., length, width) of the second metal layer 1510, which can result in an undercut, as shown at stage 5 of FIG. 15. In some implementations, the above mentioned processes may be iterated several times to provide and/or form several interconnects in one or more dielectric layers of an integrated device, redistribution portion and/or substrate.

Figure 16:
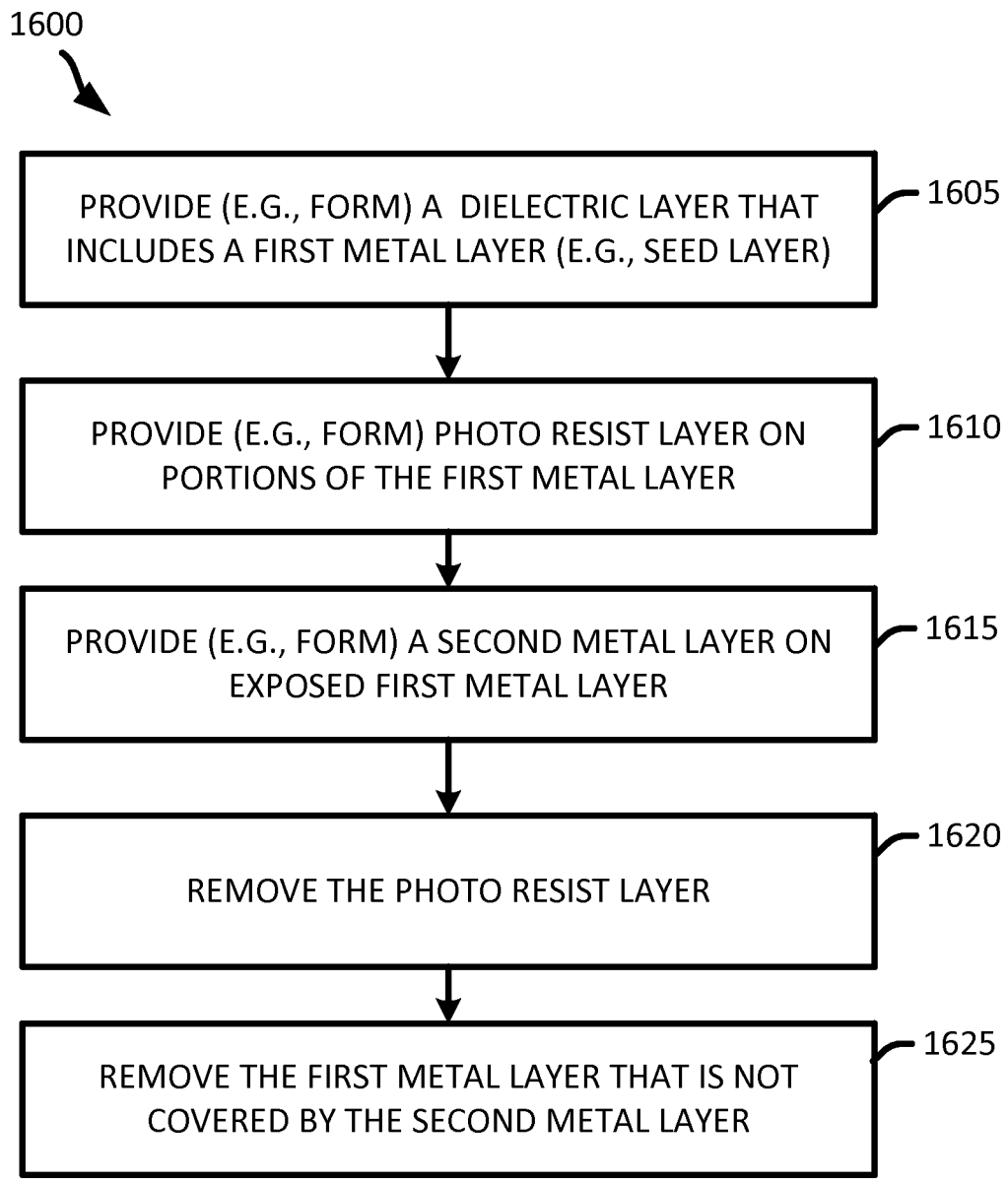
FIG. 16 illustrates an example of flow diagram of a semi-additive patterning (SAP) process.

FIG. 16 illustrates a flow diagram for a method for using a (SAP) process to provide and/or form an interconnect in one or more dielectric layer(s). The method provides (at 1605) a dielectric layer (e.g., dielectric layer 1502). In some implementations, providing the dielectric layer includes forming the dielectric layer. In some implementations, providing the dielectric layer includes forming a first metal layer (e.g., first metal layer 1504). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1610) a photo resist layer (e.g., a photo develop resist layer 1506) on the first metal layer. In some implementations, selectively providing the resist layer includes providing a first resist layer on the first metal layer and selectively removing portions of the resist layer (which provides one or more cavities).

The method then provides (at 1615) a second metal layer (e.g., second metal layer 1510) in the cavity of the photo resist layer. In some implementations, the second metal layer is formed over an exposed portion of the first metal layer. In some implementations, the second metal layer is provided by using a deposition process (e.g., plating process).

The method further removes (at 1620) the resist layer. Different implementations may use different processes for removing the resist layer. The method also selectively removes (at 1625) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 17:
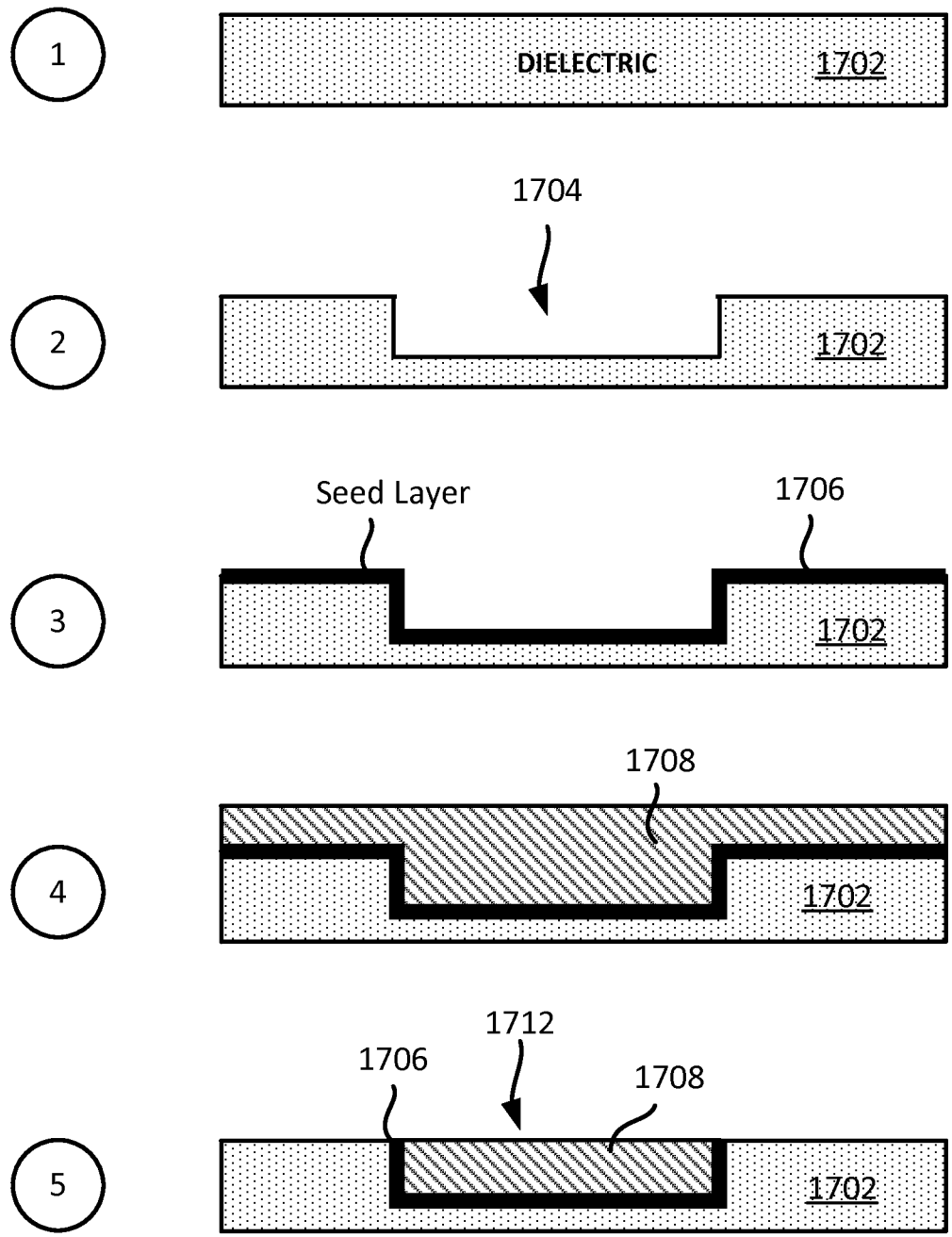
FIG. 17 illustrates an example of a damascene process.

FIG. 17 illustrates a sequence for forming an interconnect using a damascene process to provide and/or form an interconnect in a dielectric layer. As shown in FIG. 17, stage 1 illustrates a state of an integrated device after a dielectric layer 1702 is provided (e.g., formed). In some implementations, the dielectric layer 1702 is an inorganic layer (e.g., inorganic film).

Stage 2 illustrates a state of an integrated device after a cavity 1704 is formed in the dielectric layer 1702. Different implementations may use different processes for providing the cavity 1704 in the dielectric layer 1702.

Stage 3 illustrates a state of an integrated device after a first metal layer 1706 is provided on the dielectric layer 1702. As shown in stage 3, the first metal layer 1706 provided on a first surface of the dielectric layer 1702. The first metal layer 1706 is provided on the dielectric layer 1702 such that the first metal layer 1706 takes the contour of the dielectric layer 1702 including the contour of the cavity 1704. The first metal layer 1706 is a seed layer in some implementations. In some implementations, the first metal layer 1706 is provided by using a deposition process (e.g., physical vapor deposition (PVD), Chemical Vapor Deposition (CVD) or plating process).

Stage 4 illustrates a state of the integrated device after a second metal layer 1708 is formed in the cavity 1704 and a surface of the dielectric layer 1702. In some implementations, the second metal layer 1708 is formed over an exposed portion of the first metal layer 1706. In some implementations, the second metal layer 1708 is provided by using a deposition process (e.g., plating process).

Stage 5 illustrates a state of the integrated device after the portions of the second metal layer 1708 and portions of the first metal layer 1706 are removed. Different implementations may use different processes for removing the second metal layer 1708 and the first metal layer 1706. In some implementations, a chemical mechanical planarization (CMP) process is used to remove portions of the second metal layer 1708 and portions of the first metal layer 1706. As shown in stage 5, the remaining first metal layer 1706 and the second metal layer 1708 may form and/or define an interconnect 1712 (e.g., trace, vias, pads) in an integrated device and/or a substrate. As shown in stage 5, the interconnect 1712 is formed in such a way that the first metal layer 1706 is formed on the base portion and the side portion(s) of the second metal layer 1710. In some implementations, the cavity 1704 may include a combination of trenches and/or holes in two levels of dielectrics so that via and interconnects (e.g., metal traces) may be formed in a single deposition step, In some implementations, the above mentioned processes may be iterated several times to provide and/or form several interconnects in one or more dielectric layers of an integrated device and/or substrate.

Figure 18:
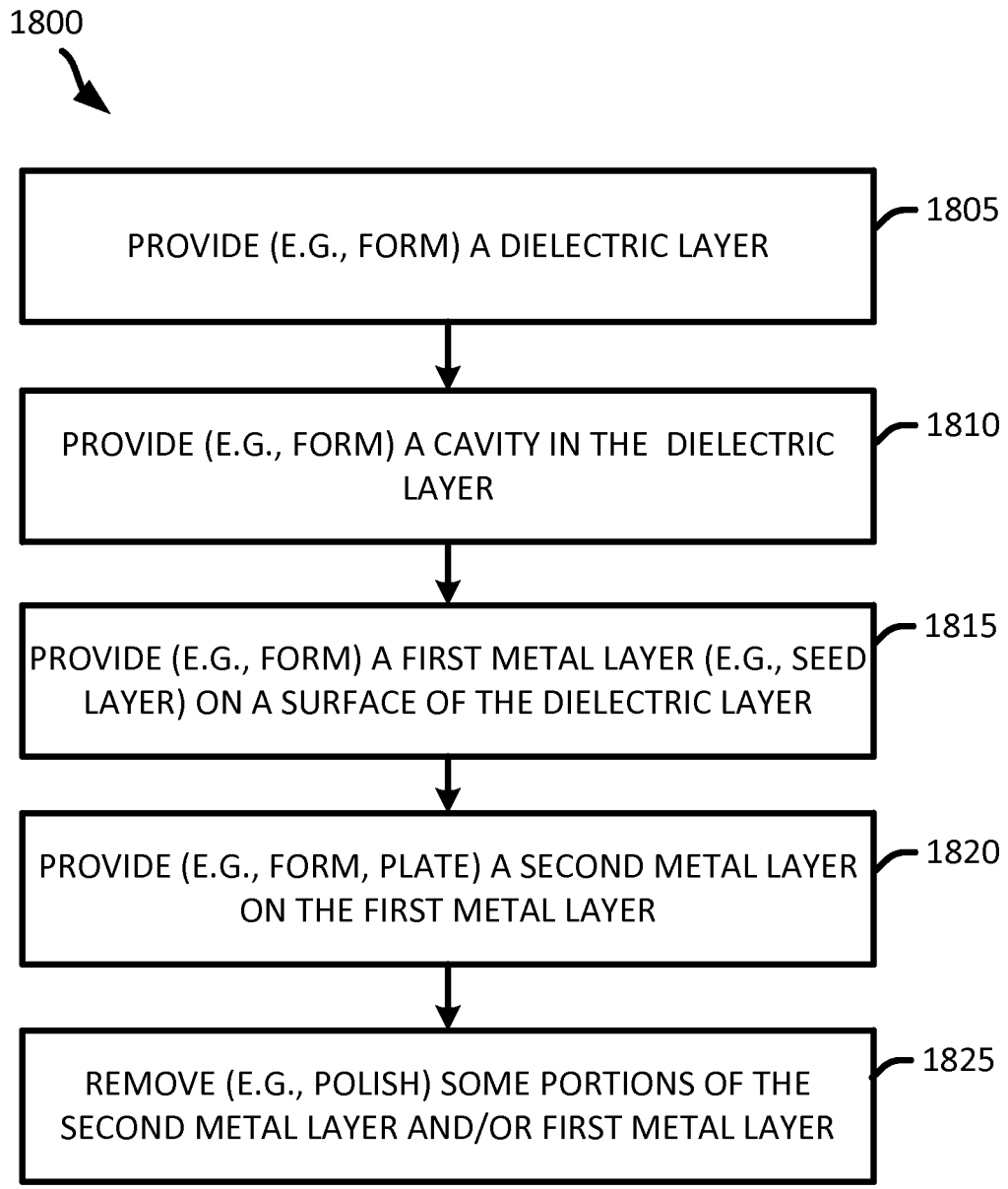
FIG. 18 illustrates an example of a flow diagram of a damascene process.

FIG. 18 illustrates a flow diagram of a method 1800 for forming an interconnect using a damascene process to provide and/or form an interconnect in a dielectric layer. The method provides (at 1805) a dielectric layer (e.g., dielectric layer 1702). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1810) at least one cavity (e.g., cavity 1704) in the dielectric layer. Different implementations may use different processes for providing the cavity in the dielectric layer.

The method provides (at 1815) a first metal layer (e.g., first metal layer 1706) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1706 is provided by using a deposition process (e.g., PVD, CVD or plating process).

The method provides (at 1820) a second metal layer (e.g., second metal layer 1708) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1825) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 1712). In some implementations, an interconnect may include one of at least a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 19:
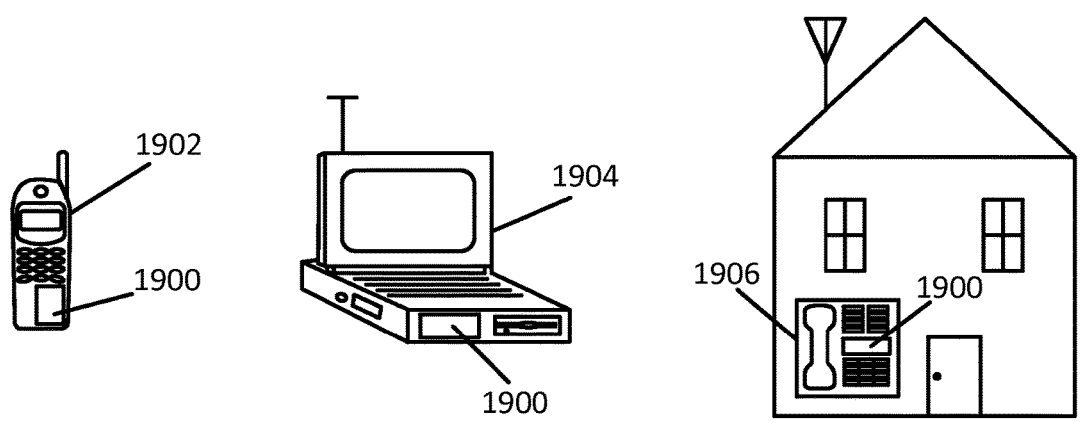
FIG. 19 illustrates various electronic devices that may integrate an integrated device, an integrated device package, a semiconductor device, a die, an integrated circuit and/or PCB described herein.

FIG. 19 illustrates various electronic devices that may be integrated with any of the aforementioned integrated device, semiconductor device, integrated circuit, die, interposer, package or package-on-package (PoP). For example, a mobile telephone 1902, a laptop computer 1904, and a fixed location terminal 1906 may include an integrated device 1900 as described herein. The integrated device 1900 may be, for example, any of the integrated circuits, dice, packages, package-on-packages described herein. The devices 1902, 1904, 1906 illustrated in FIG. 19 are merely exemplary. Other electronic devices may also feature the integrated device 1900 including, but not limited to, mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13A-13C, 14, 15, 16, 17, 18 and/or 19 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6, 7, 8, 9, 10, 11, 12, 13A-13C, 14, 15, 16, 17, 18 and/or 19 and its corresponding description in the present disclosure is not limited to dies and/or ICs. In some implementations, FIGS. 2, 3, 4, 5, 6, 7, 8, 9, 10, 11, 12, 13A-13C, 14, 15, 16, 17, 18 and/or 19 and its corresponding description may be used to manufacture, create, provide, and/or produce integrated devices. In some implementations, a device may include a die, a die package, an integrated circuit (IC), an integrated device package, a wafer, a semiconductor device, a package on package, a base portion, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package substrate comprising:
   a first dielectric layer;
   a first set of metal layers in the dielectric layer;
   a first via in the dielectric layer, the first via coupled to the first set of metal layers, wherein the first via and the first set of metal layers are configured to provide a first electrical path for a ground signal;
   a second set of metal layers in the dielectric layer; and
   a second via in the first dielectric layer, wherein a combination of the second via and at least a portion of the first set of metal layers is configured as a discrete coaxial connection in the package substrate, wherein the second via is configured to provide a second electrical path for an input/output (I/O) signal, and the second via traverses the first set of metal layers with a circumferential edge of the first set of metal layers adjacent to and surrounding the second via, and the second via traverses the second set of metal layers with a circumferential edge of the second set of metal layers adjacent to and surrounding the second via, wherein the circumferential edge of the first set of metal layers adjacent to and surrounding the second via is at least a first spacing away from the second via, and the circumferential edge of the second set of metal layers adjacent to and surrounding the second via is at least a second spacing away from the second via, the second spacing is different in dimension than the first spacing.

2. The package substrate of claim 1, further comprising a third via configured to provide a third electrical path for a power signal.

3. The package substrate of claim 1, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

4. A package substrate comprising:
   a capacitive means comprising (i) a first electrical path means comprising a first via and a first set of metal layers, the first electrical path means configured to provide a first electrical path for a ground signal, and (ii) a second electrical path means comprising a second via and a second set of metal layers, the second electrical path means configured to provide a second electrical path for a power signal; and
   a redistribution portion coupled to the capacitive means, the redistribution portion comprising:
     a dielectric layer; and
     a set of interconnects; and
   a third via configured to provide a third electrical path for an input/output (I/O) signal, wherein the third via traverses the first set of metal layers and the second set of metal layers, and the first set of metal layers includes a circumferential edge adjacent to and surrounding the third via, and the second set of metal layers include a circumferential edge adjacent to and surrounding the third via, and wherein the circumferential edge of the first set of metal layers adjacent to and surrounding the third via is at least a first spacing away from the third via, and the circumferential edge of the second set of metal layers adjacent to and surrounding the third via is at least a second spacing away from the third via, the second spacing is different in dimension than the first spacing.

5. The package substrate of claim 4, wherein the third via is part of a discrete coaxial connection means configured to provide the third electrical path.

6. The package substrate of claim 4, wherein a die is coupled to the package substrate.

7. The package substrate of claim 4, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

8. A package substrate comprising:
a first portion configured to operate as a capacitor, the first portion comprising:
a first dielectric layer;
a first set of metal layers in the dielectric layer;
a first via in the dielectric layer, the first via coupled to the first set of metal layers, wherein the first via and the first set of metal layers are configured to provide a first electrical path for a ground signal;
a second set of metal layers in the dielectric layer;
a second via in the dielectric layer, the second via coupled to the second set of metal layers, wherein the second via and the second set of metal layers are configured to provide a second electrical path for a power signal; and
a third via configured to provide a third electrical path for an input/output (I/O) signal, wherein the third via traverses the first set of metal layers and the second set of metal layers, and the first set of metal layers includes a circumferential edge adjacent to and surrounding the third via, and the second set of metal layers includes a circumferential edge adjacent to and surrounding the third via, wherein the circumferential edge of the first set of metal layers adjacent to and surrounding the third via is at least a first spacing away from the third via, and the circumferential edge of the second set of metal layers adjacent to and surrounding the third via is at least a second spacing away from the third via, the second spacing is different in dimension than the first spacing; and
a redistribution portion coupled to the first portion, the redistribution portion comprising:
a second dielectric layer; and
a set of interconnects.

9. The package substrate of claim 8, wherein a combination of the third via and at least a portion of the first set of metal layers is configured as a discrete coaxial connection in the first portion.

10. The package substrate of claim 9, wherein the second spacing is greater than the first spacing.

11. The package substrate of claim 8, wherein the first dielectric layer includes a ceramic material.

12. The package substrate of claim 8, wherein a die is coupled to the package substrate.

13. The package substrate of claim 8, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

14. A method for fabricating a package substrate comprising a capacitor, the method comprising:
forming a first portion configured as the capacitor, wherein forming the first portion comprises:
forming a first dielectric layer;
forming a first set of metal layers in the dielectric layer;
forming a first electrical path for a ground signal, wherein forming the first electrical path for a ground signal comprises forming a first via in the dielectric layer, and coupling the first via to the first set of metal layers;
forming a second set of metal layers in the dielectric layer; and
forming a second electrical path for a power signal, wherein forming the second electrical path for the power signal further comprises forming a second via in the dielectric layer and coupling the second via to the second set of metal layers;
forming a third via configured to provide a third electrical path for an input/output (I/O) signal, wherein the third via traverses the first set of metal layers and the second set of metal layers, and the first set of metal layers includes a circumferential edge adjacent to and surrounding the third via, and the second set of metal layers include a circumferential edge adjacent to and surrounding the third via, wherein the circumferential edge of the first set of metal layers adjacent to and surrounding the third via is at least a first spacing away from the third via, and the circumferential edge of the second set of metal layers adjacent to and surrounding the third via is at least a second spacing away from the third via, the second spacing is different in dimension than the first spacing; and
forming a redistribution portion on the first portion, wherein forming the redistribution portion comprises:
forming a second dielectric layer; and
forming a set of interconnects.

15. The method of claim 14, wherein a combination of the third via and at least a portion of the first set of metal layers is configured as a discrete coaxial connection in the first portion.

16. The method of claim 15, wherein the second spacing is greater than the first spacing.

17. The method of claim 14, wherein the first dielectric layer includes a ceramic material.

18. The method of claim 14, further coupling a die to the package substrate comprising the first portion and the redistribution portion.

19. The method of claim 14, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *